United States Patent
Bryson et al.

(10) Patent No.: US 9,647,657 B1
(45) Date of Patent: May 9, 2017

(54) PROGRAMMABLE SLEW RATE POWER PATH SWITCH WITH INTEGRATED SUPER CAPACITOR CHARGING SYSTEM

(71) Applicant: GLF Integrated Power, Inc., Santa Clara, CA (US)

(72) Inventors: Stephen W. Bryson, Cupertino, CA (US); Ni Sun, Sunnyvale, CA (US)

(73) Assignee: GLF Integrated Power, Inc., Santa Clara, CA (US)

( * ) Notice: Subject to any disclaimer, the term of this patent is extended or adjusted under 35 U.S.C. 154(b) by 436 days.

(21) Appl. No.: 14/469,270

(22) Filed: Aug. 26, 2014

(51) Int. Cl.
  *H02H 9/08* (2006.01)
  *H03K 17/16* (2006.01)
  *H02J 9/06* (2006.01)
  *H02J 7/34* (2006.01)
  *H02H 1/04* (2006.01)

(52) U.S. Cl.
  CPC ............ *H03K 17/161* (2013.01); *H02J 7/345* (2013.01); *H02J 9/06* (2013.01); *H02H 1/043* (2013.01); *Y10S 323/908* (2013.01)

(58) Field of Classification Search
  USPC ......................................... 361/18, 93.7–93.9
  See application file for complete search history.

(56) References Cited

U.S. PATENT DOCUMENTS

| | | | | |
|---|---|---|---|---|
| 2008/0088997 | A1* | 4/2008 | So | H02H 9/025 361/93.7 |
| 2013/0314830 | A1* | 11/2013 | Zamprogno | H02H 3/207 361/86 |

* cited by examiner

*Primary Examiner* — Danny Nguyen
(74) *Attorney, Agent, or Firm* — Pillsbury Winthrop Shaw Pittman LLP

(57) ABSTRACT

A fully integrated circuit configuration that can be used to control the power path of a pair of PMOS load switches is described. The circuit also integrates a programmable slew rate for the second PMOS load switch in order to control the power path from the input system voltage (battery or power supply) or from a backup source of power. The integrated circuit configuration also contains a charge pump circuit which can be used to charge the backup source of power to a voltage that is greater than the input voltage.

14 Claims, 4 Drawing Sheets

US 9,647,657 B1

PROGRAMMABLE SLEW RATE POWER PATH SWITCH WITH INTEGRATED SUPER CAPACITOR CHARGING SYSTEM

FIELD OF THE ART

Modern electronic data storage systems are moving increasingly away from the older mechanical systems such as hard disk drives (HDD) to more electronic intensive solutions such as flash memory and solid state drives (SSD). This shift has become popular because of the reduced size and power requirements and increased speed of solid state storage media over mechanical rotating hard disk drives. Solid state storage solutions also offer many advantages over the HDD in portable systems such as notebook computers as well as tablet computing platforms. In the case of a conventional SSD, memory storage unit such as a 64 GB memory, a large capacitor can store enough energy to be able run the memory for a few milliseconds to allow data to be written prior to the voltage decaying below the memory's operating voltage. For larger SSD data storage devices, several seconds may be required for the system to be able to write all of the data into non-volatile memory before the power is gone. How to obtain several seconds of power for such back-up is a problem.

SUMMARY

An object is to provide current paths through a pair of power MOSFETs, which current paths are controlled by a slew rate control block during initial turn-on in order to provide system power, as well as to charge a back-up source of power should system power be lost, as well as power.

In a preferred embodiment, the backup source of power is preferably large capacitor, referred to also as a Super capacitor, that is charged to a voltage that is higher than the VIN voltage by utilizing an on board charge pump (CP) or for even larger capacitances, a boost converter circuit.

In the event of a power loss situation, an Under Voltage Lock Out (UVLO) circuit will detect the loss of power and disconnect the main PMOS power switch from system power. At the same time, it also connects the Super capacitor via the second PMOS power device, thereby providing a backup power source to the system as the system goes through an orderly shutdown of its functions during the time that the Super capacitor is providing the power.

A further object is the ability of the slew rate control for the second power MOSFET used to charge the Super capacitor to be modified based upon the function that it is performing. In particular, initially, with no charge on the Super capacitor, the slew rate control of the second MOSFET is set to a very long slew rate time, whereas when the system detects a power loss, the switching of the second power MOSFET is done fast enough so that no system functionality is lost. This sophisticated functionality is possible because of the programmable slew rate module.

Another embodiment contains a reverse current blocking (RCB) circuit for each PMOS power device. This insures that when each PMOS power device is turned off, there can be no reverse current flowing, which is especially important for the second PMOS switch that is connected between the VSYS output pin and the Super capacitor. It is also important in the case of the main PMOS switch that is connected to VIN, because reverse current could be diverted into the system power supply thereby reducing the amount of time that the Super capacitor can supply voltage when used to supply backup power.

DESCRIPTION OF THE PREFERRED EMBODIMENT

Figure 1:
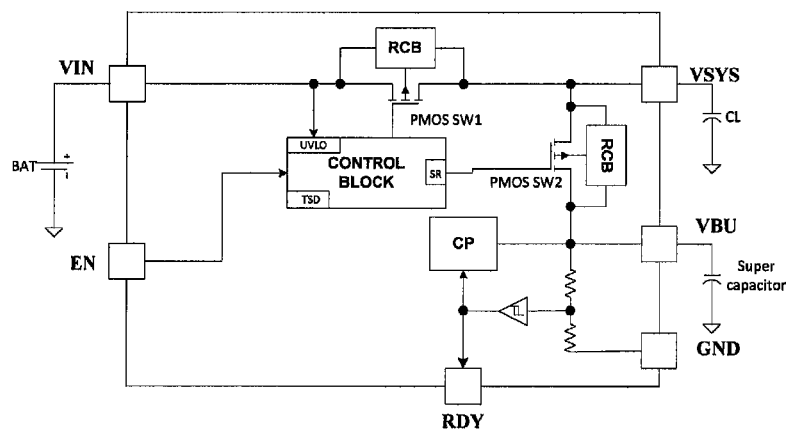
FIG. 1 is an overall block diagram of the power PMOS load switch with slew rate control and the charging system for the backup source of power.

New applications are emerging in the data center storage space that are driving even more of a shift from the traditional HDD storage solution to SSD solutions. For these new applications, the amount of storage that is required is increasing from the 10-40 GB range per memory system to the 256-512 GB range and beyond. With this increased storage requirement comes challenges. One of these challenges is how to keep all of the data safe in the event of a loss of power, though more power is needed.

One solution to this problem of backup power is the use of a backup source of power in the form of a large capacitor, referred to herein as a Super capacitor. The Super capacitor can be charged up to the supply voltage and used as a temporary back up power so that the system can perform an orderly shutdown in the event of a power outage. The size of the Super capacitors can vary widely, from 10 mF to 1000 mF. At this current moment, the Super capacitor voltage range is between 3.6V-15V. This voltage range fits with the range of the chosen technology to support it. For example, most system level SSD applications use 12V for power, while in the mobile domain voltages can range from 3.5V to 8V. The use, however, of the Super capacitor as a backup storage element capable of storing sufficient charge and also not interfering with operation of the overall system is not simple and presents many challenges including charging time, maximum current available for charging, and crossover switching time during a power failure.

In use, the Super capacitor is preferably charged to a voltage that is higher than the VIN voltage by utilizing an on board charge pump (CP) or for even larger capacitances, a boost converter circuit.

In an embodiment overview, a controlled current path is provided from the system power input on the VIN input pin to the load on the VSYS pin through a first power MOSFET switch (PMOS SW1) as well as to the load on the VBU pin through a second power MOSFET switch (PMOS SW2), (see FIG. 1) The slew rate control block provides dv/dt control during the initial turn on of the VBU pin load through the second power MOSFET when the chip is enabled by the EN input pin. This second power MOSFET diverts some of the input current in order to charge the Super capacitor, which will then be further charged to a voltage that is higher than the VIN voltage by utilizing an on board charge pump (CP) or for larger capacitances, a boost converter circuit.

During the initial turn on phase when EN is brought high, both power MOSFETs will be turned on allowing both the VSYS output load and the Super capacitor to be charged to the same voltage, VIN. Once the Super capacitor has been charged to the VIN voltage, the second power MOSFET that is connected between the VSYS pin and the VBU pin will turn off and become open. This allows the charge pump to continue to charge the Super capacitor to a voltage that is equal to or higher than the VIN voltage. By providing this over charging the system has a longer functional delay time for writing data to the non-volatile memories during a power interruption. (since i=C*Δv/Δt, increasing v will allow t to be longer) The charge pump may also be used to trickle charge the Super capacitor so that the voltage on the VBU bin can be maintained to the VIN voltage over long periods of time. For backup voltages of more than 1V above the VIN voltage a boost converter may be used. Once the Super capacitor has been charged to the desired level, the charge pump turns off. During the normal operation of the system, power to the load will be provided by the main PMOS switch (SW1) connecting VIN to VSYS, while the second PMOS switch (SW2) will remain open. A power monitor circuit monitors the voltage on the VBU pin and should the voltage on the Super capacitor drop below the minimum desired level, the charge pump would once again be enabled and charge the Super capacitor back to its target voltage.

In the event of a power loss situation, the UVLO (Under Voltage Lock Out) circuit detects the loss of power and disconnects the main PMOS power switch from the VIN input pin. At the same time, it also connects the Super capacitor at the VBU pin to the VSYS pin via the second PMOS power device, thereby providing a backup power source to the system while it attempts to go through an orderly shutdown of its functions during the time that the Super capacitor is providing the power.

Another aspect is the ability of the slew rate control for the second power MOSFET to be modified based upon the function that it is performing. That is to say that initially with no charge on the Super capacitor, the slew rate control of the second MOSFET is preferably set to a long slew rate time, perhaps as much as several seconds. This reduces the amount of current that is required from the system power input pin VIN to charge up the very large capacitance of the Super capacitor, allowing the systems to continue to work while also charging the Super capacitor. On the other hand, when the system detects a power loss, the switching of the second power MOSFET must be done fast enough so that no system functionality is lost—i.e. the charge in the Super capacitor must be available quickly. Therefore during that transition from off to on for the second power MOSFET, a faster slew rate transition time would be employed, perhaps more along the lines of a 1-3 ms turn on time. This sophisticated functionality is possible because of the programmable slew rate module that controls the rise time of the power MOSFET between the VSYS pin and the VBU pin.

Another one of the key features of the system design is that each PMOS power device contains a reverse current blocking (RCB) circuit. This insures that when each PMOS is turned off, there can be no reverse current flowing. This is particularly true for the second PMOS switch that is connected between the VSYS output pin and the Super capacitor on the VBU pin. It is important for this current path to insure that when the switch between VSYS and VBU is turned off that no current can flow to VSYS from VBU otherwise there will be a discharging of the voltage on the Super capacitor. It is also important in the case of the main PMOS switch that is connected to YIN, because reverse current could be diverted into the system power supply thereby reducing the amount of time that the Super capacitor can supply voltage to the load at the SYS pin.

Figure 2:
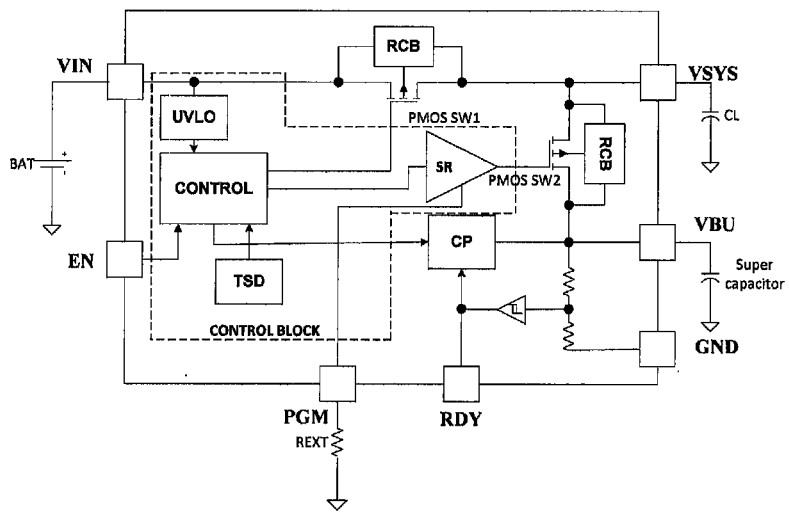
FIG. 2 shows a one embodiment of the system where the slew rate control is programmable via an external resistor connected to the PGM pin.

In view of the above overview, and now referring to the figures and drawings in detail, FIG. 1 shows the overall block diagram of the preferred embodiment of the invention with the main power path between the VIN input pin and the VSYS output pin of the integrated circuit, with all components described being on the single integrated circuit chip other than the power source, the Super capacitor and CL2, whereas FIG. 2 shows further details of a specific embodiment of the control block of FIG. 1, as well as control using an external resistor, as discussed hereinafter. A PMOS load switch (SW1) is connected between the said input pin and said output pin and is controlled by the operation of the EN (enable) input pin. The main PMOS load switch is a large geometry power MOSFET where the on resistance ($R_{DSON}$) is less than 50 mΩ. Additionally the low $R_{DSON}$ power MOSFET is coupled with a reverse current blocking (RCB) system which prevents any current from flowing backwards from the VSYS pin to the VIN pin. The rise time of the second PMOS switch (SW2) is controlled by the SR block which is connected to an external input pin, PGM.

As shown in FIG. 2, an external resistor having a selected resistance can be connected to the PGM input pin in order to allow control selection of the slew rate of the PMOS load switch from external to the. This function is advantageous due to the fact that different systems and different Super capacitors can have widely varying load characteristics and the ability to externally adjust the MOSFET's rise time to various types of Super capacitor loads provides the user with the most flexibility possible for a variety of conditions. In one embodiment, the slew rate of SW1 which connects YIN to VSYS is fixed internally by the control module. The slew rate control of SW2, however, which is between VSYS and VBU, is programmable such as using the selected value (out of many) of the external resistor, in a manner similar to the previous slew rate controlled load switches) because of the variability of capacitor sizes that might be connected to the VBU pin.

The second power path between the VSYS output pin and the VBU pin connects to the backup power storage device, a Super capacitor. The second PMOS load switch is connected between the VSYS output pin and the VBU backup power source pin. This PMOS load switch consists of an additionally large geometry MOSFET with an on resistance that is less than 25 mΩ. The difference in the MOSFET sizes is significant to the power path operation in two ways.

First, since the on resistance of the switch between the VSYS and the VBU pin is very low, there will be very little voltage drop across the switch when the system power is being supplied from the Super capacitor. Thus, the system can have a potentially longer time to operate before it reaches the critical voltage level that will cause some of its circuits to lose functionality.

Figure 4:
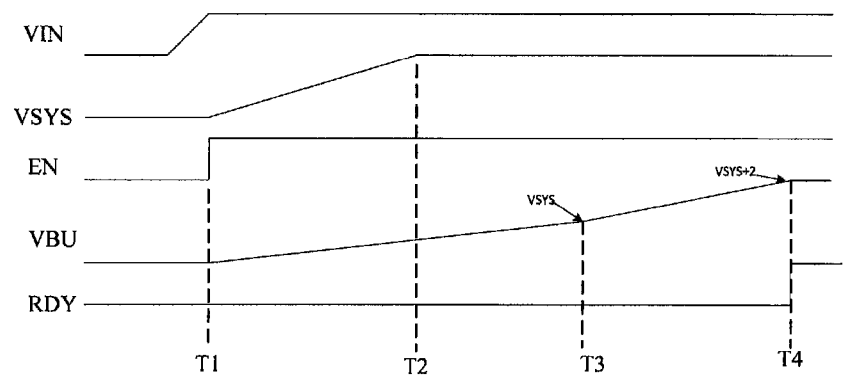
FIG. 4 shows the timing diagram for the charging sequence of the backup source of power when implemented as a Super capacitor.
Figure 5:
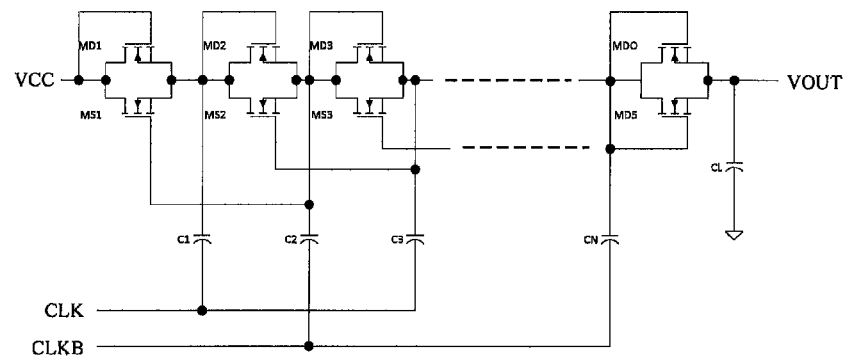
FIG. 5 shows the one possible implementation of an integrated charge pump circuit that can be used to keep the Super capacitor charged.

Secondly, during the initial power up (see FIG. 4), the main power path switch and the backup power path switches are both turned on (T1) allowing the load at the VSYS pin to begin powering on as well as the backup power source to charge. Since the turn on time of the switches are different, more current will be allowed to flow to the VSYS pin due to the very long turn on time of the second power MOSFET. This will allow the system to turn on faster than the backup storage device can charge. Once the system has been fully turned on (T2), the backup storage device will continue to charge until it reaches the same voltage as the VSYS pin (T3). At that point, the second PMOS power path switch will be turned off disconnecting the VSYS pin from the VBU pin. In order to provide some additional time for the Super capacitor to continue to back up the system in the event of a power loss, the Super capacitor is further charged by use of the integrated charge pump circuit (CP). Once the voltage on the VBU pin has charged to the same voltage as the VSYS pin, the second power path PMOS switch disconnects the VSYS pin from the VBU pin, and the charge pump (FIG. 5) is activated in order to complete the Super capacitor charging sequence (T4). When the VBU voltage level has reached the desired level, a comparator will switch and provide a ready signal (RDY) to indicate to the system controller that the Super capacitor has been fully charged. The RDY signal is also used to stop the charge pump from any further charging of the Super capacitor, The RDY comparator will continue to monitor the voltage on the VBU pin and should the Super capacitor voltage decay below the set point of the RDY comparator, the charge pump will once again be engaged to replace any lost charge and pump the voltage up until the Super capacitor voltage is once again at fully charged.

To further control the operation of the power path switch system, an under voltage lock out block (UVLO) is employed. This block is used to monitor the status of the input voltage on the VIN input pin Should the input voltage on the YIN pin drop below the minimum set VIN voltage, the UVLO will signal the control circuitry that power has been lost thereby initiating the power backup sequence for the VSYS output pin. Again, once this condition has be detected, the main power path MOSFET will be turned off to disconnect the VIN pin from the VSYS pin. At the same time, the second power path MOSFET will be turned on, connecting the VSYS pin to the VBU pin with the backup power source.

The main power path switch is further protected from damage by the inclusion of a thermal shutdown block (TSD). The TSD cell is set to cause the main load switch to disconnect the YIN input pin from the VSYS and VBU load pins should the die temperature exceed a temperature of 150° C. This protects the load switch from being over stressed due to an output short circuit to ground on either the VSYS or the VBU pins. The TSD cell has built in temperature hysteresis so that if the short at the output is removed, the load switch can be re-enabled when the die temperature returns to a temperature that is below 125° C.

Figure 3:
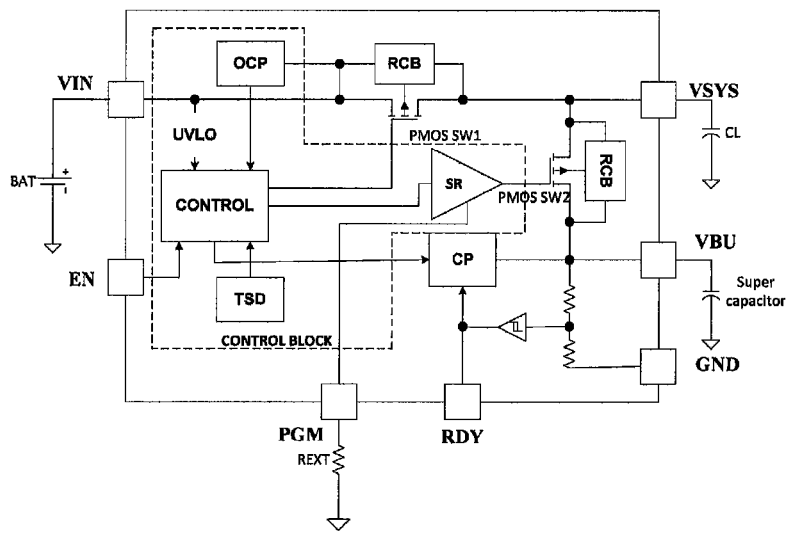
FIG. 3 shows another embodiment of the system where the control block includes an Over Current Protection (OCP) function.

In a further embodiment shown in FIG. 3, an overcurrent protection system (OCP) is added to that which was previously described above with respect to FIGS. 1 and 2. In this system the OCP is used to detect dangerous current levels through the main power path load switch and throttle back the current level to a pre-determined safe operating current. This feature allows the system to continue operating until such time as the controller determines that a system fault has occurred, such as an inadequate system voltage level. In that case the controller can continue to insure that an orderly shutdown of the system occurs.

Figure 6:
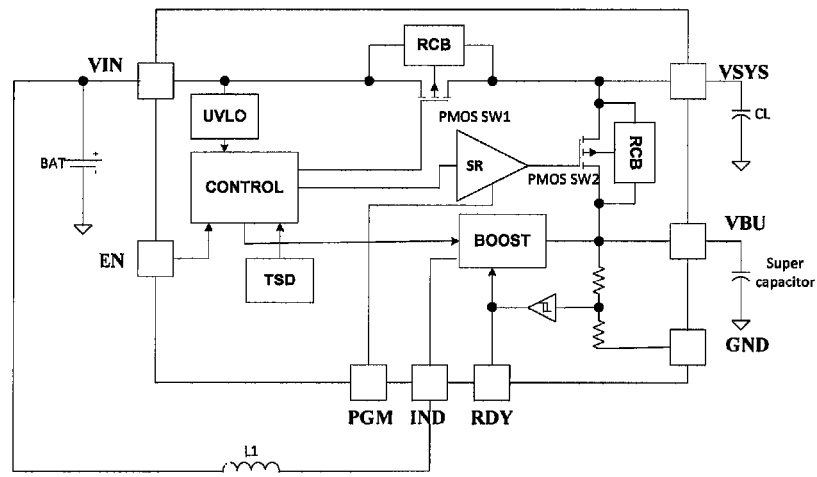
FIG. 6 shows another embodiment of the system where the charge pump circuit has been replaced by a boost converter with the addition of an external inductor L1.
Figure 7:
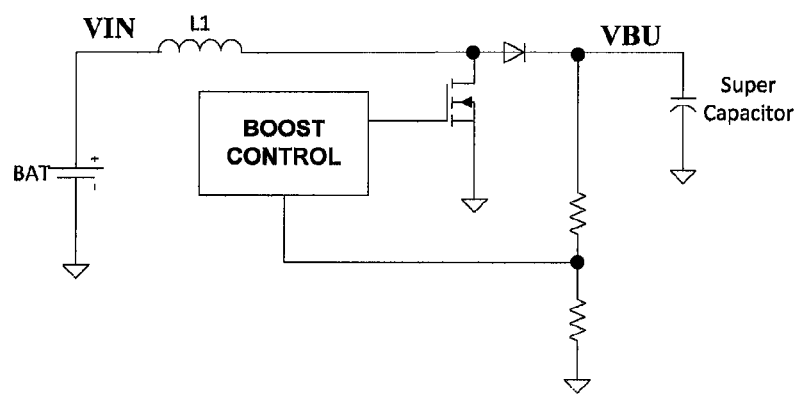
FIG. 7 shows the specific boost converter configuration.

For some types of systems, much larger capacitance may be required of the Super capacitor than a charge pump type of circuit can provide voltage pumping for. In these types of applications a simple boost converter (FIG. 7) can be used in place of the charge pump. In order to utilize the boost configuration, an additional input pin needs to be added to the configuration as is shown in FIG. 6. This allows for the connection of the boost inductor L1 to the VIN pin.

Although described herein with reference to the preferred embodiment, one skilled in the art will readily appreciate that other applications may be substituted for those set forth herein without departing from the intended spirit and scope.

The invention claimed is:

1. A switching circuit connectable between an input source voltage both an output load for controlling an inrush current to the output load upon turn-on and also a backup power capacitor that provides backup power, the switching circuit including:
an integrated circuit, the integrated circuit including:
a first power PMOS load switch including a first load switch gate, a first load switch source and a first load switch drain, the inrush current to an output load passing from the load switch source to the load switch drain and being controlled by a load switch control voltage on the load switch gate;
a second power PMOS load switch including a second load switch gate, a second load switch source and a second load switch drain that is connected between the output load and the backup power capacitor; and
a slew rate control circuit connected to the first and second load switch gates of the first and second power PMOS load switches, respectively, that provides load switch control voltages to each of the first and second power PMOS load switches, the slew rate control circuit providing a first set of control signals that provides for low current charging through the second power PMOS load switch while also supplying the inrush current through the first power PMOS load and further providing a second set of control signals that provides for a discharge path through the second power PMOS load switch to supply backup from the backup power capacitor to the output load upon detection of a loss of the input source voltage.

2. The switching circuit according to claim 1, wherein a second slew rate control signal that controls the second power PMOS load is set to obtain a second slew rate that is multiple times longer than a first slew rate that is controlled by a first slew rate control signal that controls the first power PMOS load.

3. The switching circuit according to claim 2 wherein the second slew rate is at least 2 seconds.

4. The switching circuit according to claim 2 wherein a first on-resistance of the first PMOS load switch is larger than a second on-resistance of the second PMOS load switch.

5. The switching circuit according to claim 4 wherein the first on-resistance of the first PMOS load switch is less than 50 mΩ and the second on-resistance of the second PMOS load switch is less than 25 mΩ.

6. The switching circuit according to claim 1, further including a charge pump that is used to charge the backup power capacitor to a voltage that is greater than the input voltage.

7. The switching circuit according to claim 6 further including an under voltage lockout circuit that is used to monitor the input voltage.

8. The switching circuit according to claim 6 further including a thermal shutdown circuit that protects said first and second PMOS load switches from on chip die temperatures in excess of 150° C.

9. The switching circuit according to claim 8 further including an over current protection circuit that monitor the inrush current through the first PMOS load switch.

10. The switching circuit according to claim 1 further including a boost converter that is used to charge the backup power capacitor to a voltage that is greater than the input voltage.

11. The switching circuit according to claim 10 further including an under voltage lockout circuit that is used to monitor the input voltage.

12. The switching circuit according to claim 11 further including a thermal shutdown circuit that protects said first and second PMOS load switches from on chip die temperatures in excess of 150° C.

13. The switching circuit according to claim 12 further including an over current protection circuit that monitor the inrush current through the first PMOS load switch.

14. The switching circuit according to claim 12 further including an external resistor having a selected resistance that allows external selection of the slew rate of the PMOS load switch.

* * * * *